United States Patent
Ueda et al.

(10) Patent No.: US 11,374,054 B2
(45) Date of Patent: Jun. 28, 2022

(54) INORGANIC EL ELEMENT, DISPLAY ELEMENT, IMAGE DISPLAY DEVICE, AND SYSTEM

(71) Applicant: RICOH COMPANY, LTD., Tokyo (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP); Yuichi Ando, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 32 days.

(21) Appl. No.: 16/981,933

(22) PCT Filed: Mar. 13, 2019

(86) PCT No.: PCT/JP2019/010244
§ 371 (c)(1),
(2) Date: Sep. 17, 2020

(87) PCT Pub. No.: WO2019/181686
PCT Pub. Date: Sep. 26, 2019

(65) Prior Publication Data
US 2021/0043679 A1 Feb. 11, 2021

(30) Foreign Application Priority Data

Mar. 19, 2018 (JP) .............................. JP2018-050862
Feb. 26, 2019 (JP) .............................. JP2019-032268
Mar. 11, 2019 (JP) .............................. JP2019-043381

(51) Int. Cl.
*H01L 27/15* (2006.01)
*G09G 3/32* (2016.01)
(Continued)

(52) U.S. Cl.
CPC ............. *H01L 27/156* (2013.01); *G09G 3/32* (2013.01); *H01L 33/18* (2013.01); *H01L 33/26* (2013.01);
(Continued)

(58) Field of Classification Search
USPC ........................................................ 345/212
See application file for complete search history.

(56) References Cited

U.S. PATENT DOCUMENTS 5,631,664 A * 5/1997 Adachi .................... H01J 1/312
315/169.3
6,111,274 A * 8/2000 Arai ........................ H01L 33/26
257/E33.044
(Continued)

FOREIGN PATENT DOCUMENTS

CN 104124316 A 10/2014
EP 1806791 A2 7/2007
(Continued)

OTHER PUBLICATIONS

J. C. Ronfard-Haret, J. Kossanyi, "Electro- and photoluminescence of the Tm3+ ion in Tm3+-and Li+-doped ZnO ceramics. Influence of the sintering temperature", Chem. Phys. 241 (1999) 339-349.
(Continued)

*Primary Examiner* — Chineyere D Wills-Burns
(74) *Attorney, Agent, or Firm* — Xsensus LLP

(57) ABSTRACT

An inorganic EL element including: an anode; a hole transporting layer; a light emitting layer; an electron transporting layer; and a cathode, the anode, the hole transporting layer, the light emitting layer, the electron transporting layer, and the cathode being stacked, wherein the hole transporting layer is an oxide film, the light emitting layer is an oxide film, and the electron transporting layer is an oxide film.

19 Claims, 6 Drawing Sheets

(51) Int. Cl.
  *H01L 33/18* (2010.01)
  *H01L 33/26* (2010.01)
  *H05B 33/14* (2006.01)
  *H01L 27/12* (2006.01)
(52) U.S. Cl.
  CPC ... *G09G 2300/08* (2013.01); *G09G 2320/043* (2013.01)

(56) References Cited

U.S. PATENT DOCUMENTS

| | | | |
|---|---|---|---|
| 8,268,666 B2 | 9/2012 | Abe et al. | |
| 8,492,761 B2 | 7/2013 | Abe et al. | |
| 8,704,267 B2 | 4/2014 | Godo | |
| 9,105,473 B2 | 8/2015 | Ueda et al. | |
| 9,112,039 B2 | 8/2015 | Ueda et al. | |
| 9,536,957 B2 | 1/2017 | Abe et al. | |
| 9,761,673 B2 | 9/2017 | Abe et al. | |
| 10,115,828 B2 | 10/2018 | Abe et al. | |
| 10,141,185 B2 | 11/2018 | Ueda et al. | |
| 10,170,635 B2 | 1/2019 | Matsumoto et al. | |
| 2002/0196725 A1* | 12/2002 | Marshall | G11B 9/1409 369/126 |
| 2003/0020397 A1* | 1/2003 | Beatty | H01L 51/5262 313/503 |
| 2004/0032203 A1* | 2/2004 | Mikami | H05B 33/28 313/502 |
| 2004/0245912 A1* | 12/2004 | Thurk | H05B 33/14 313/484 |
| 2004/0256983 A1* | 12/2004 | Hung | H01L 51/5281 313/506 |
| 2004/0262620 A1* | 12/2004 | Albrecht | H01L 33/42 257/79 |
| 2005/0017261 A1* | 1/2005 | Ishizaki | H01L 21/02422 438/46 |
| 2006/0233969 A1* | 10/2006 | White | H01L 21/0256 118/723 R |
| 2006/0244373 A1* | 11/2006 | Nomura | H01L 51/5012 428/917 |
| 2007/0108446 A1* | 5/2007 | Akimoto | H01L 29/7869 257/E29.147 |
| 2007/0170446 A1* | 7/2007 | Cho | H05B 33/14 257/98 |
| 2007/0221945 A1 | 9/2007 | Honda | |
| 2008/0199669 A1 | 8/2008 | Lee et al. | |
| 2009/0128005 A1* | 5/2009 | Kumazawa | H01L 51/0021 313/500 |
| 2009/0315026 A1 | 12/2009 | Jeong et al. | |
| 2010/0032687 A1* | 2/2010 | Calder | H05B 33/145 257/E33.001 |
| 2011/0128275 A1 | 6/2011 | Ueda et al. | |
| 2011/0133175 A1* | 6/2011 | Ryu | H01L 33/405 257/43 |
| 2014/0009514 A1 | 1/2014 | Abe et al. | |
| 2014/0175440 A1* | 6/2014 | Mohammed | H05B 33/14 257/52 |
| 2014/0353648 A1 | 12/2014 | Abe et al. | |
| 2015/0129876 A1 | 5/2015 | Mohammed et al. | |
| 2017/0005235 A1* | 1/2017 | Chou | H01L 33/38 |
| 2017/0141237 A1 | 5/2017 | Arae et al. | |
| 2017/0154998 A1 | 6/2017 | Ueda et al. | |
| 2017/0162172 A1 | 6/2017 | Saotome et al. | |
| 2017/0162704 A1 | 6/2017 | Abe et al. | |
| 2017/0170333 A1* | 6/2017 | Matsumoto | H01L 27/1225 |
| 2017/0301738 A1 | 10/2017 | Abe et al. | |
| 2017/0345901 A1 | 11/2017 | Abe et al. | |
| 2018/0222766 A1* | 8/2018 | Roqan | H01L 21/02631 |
| 2019/0064596 A1* | 2/2019 | Chen | G02F 1/133609 |
| 2021/0384454 A1* | 12/2021 | Zhang | H01L 51/508 |

FOREIGN PATENT DOCUMENTS

| | | |
|---|---|---|
| JP | 2000-340366 A | 12/2000 |
| JP | 2002-015858 | 1/2002 |
| JP | 2006-344584 | 12/2006 |
| JP | 2008-244387 | 10/2008 |
| JP | 2010-050421 | 3/2010 |
| JP | 2012-216780 | 11/2012 |
| JP | 2013-138165 | 7/2013 |
| JP | 201 4-035827 | 2/2014 |
| JP | 2018-148216 | 9/2018 |
| KR | 10-2008-0110747 A | 12/2008 |
| KR | 10-2009-0131402 A | 12/2009 |
| KR | 10-1304635 B1 | 9/2013 |
| TW | 200834607 A | 8/2008 |
| WO | WO2014/099443 A1 | 6/2014 |

OTHER PUBLICATIONS

International Search Report dated Jun. 6, 2019 for counterpart International Patent Application No. PCT/JP2019/010244 filed Mar. 13, 2019.
Written Opinion dated Jun. 6, 2019 for counterpart International Patent Application No. PCT/JP2019/010244 filed Mar. 13, 2019.
Taiwanese Office Action dated Nov. 14, 2019 (dated Nov. 18, 2019) for corresponding Taiwanese Application No. 108108517 (with English translation).
Taiwanese Decision of Rejection dated Mar. 30, 2020 (dated Mar. 31, 2020) for corresponding Taiwanese Application No. 108108517 (with English translation).
Office Action dated Oct. 29, 2021 in Korean Patent Application No. 10-2020-7029682, 15 pages.
Office Action issued Apr. 27, 2022, in corresponding Korean Patent Application 10-2020-7029682.

* cited by examiner

[Fig. 1]
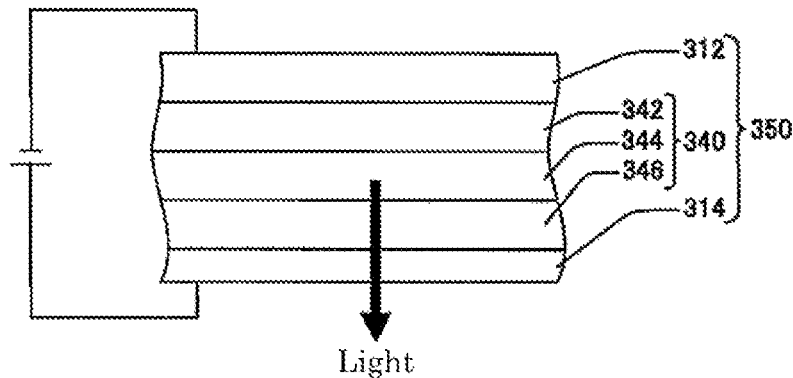
Light
[Fig. 2]
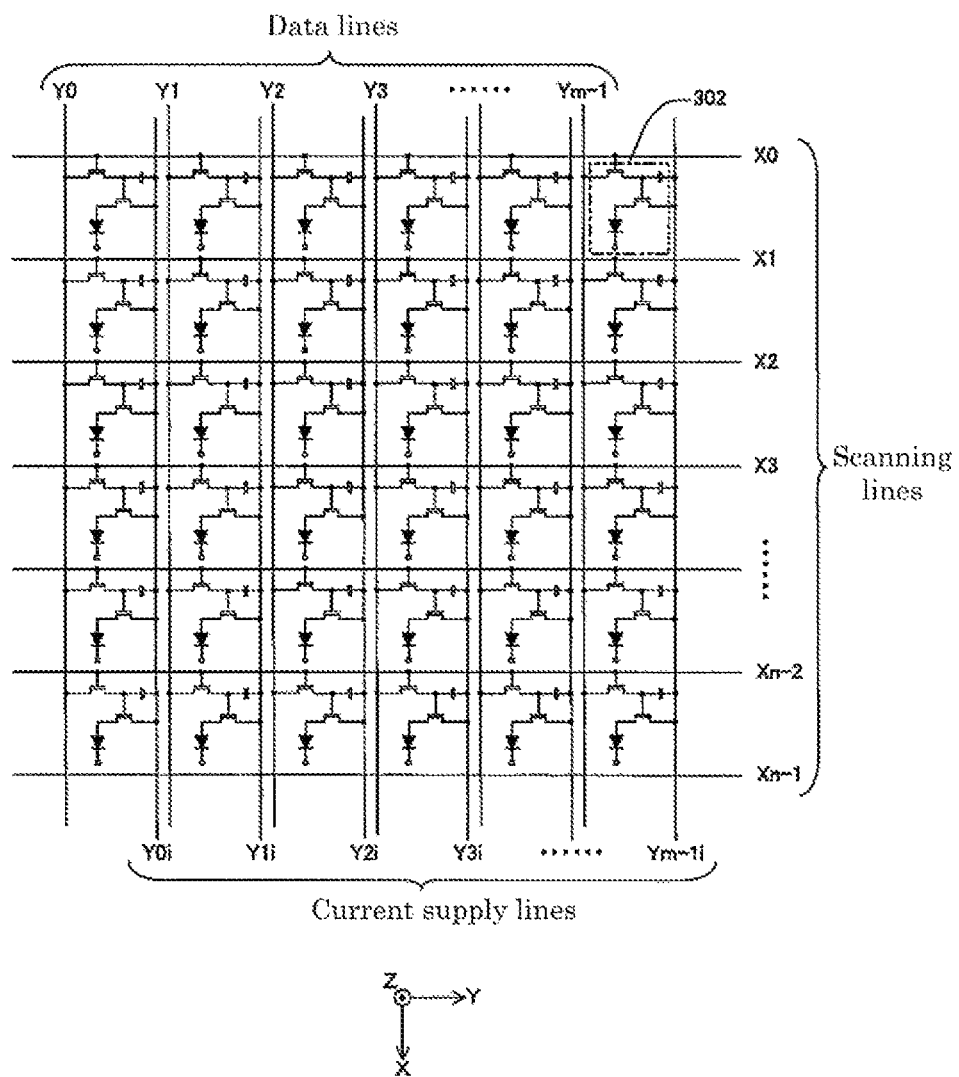

[Fig. 3]
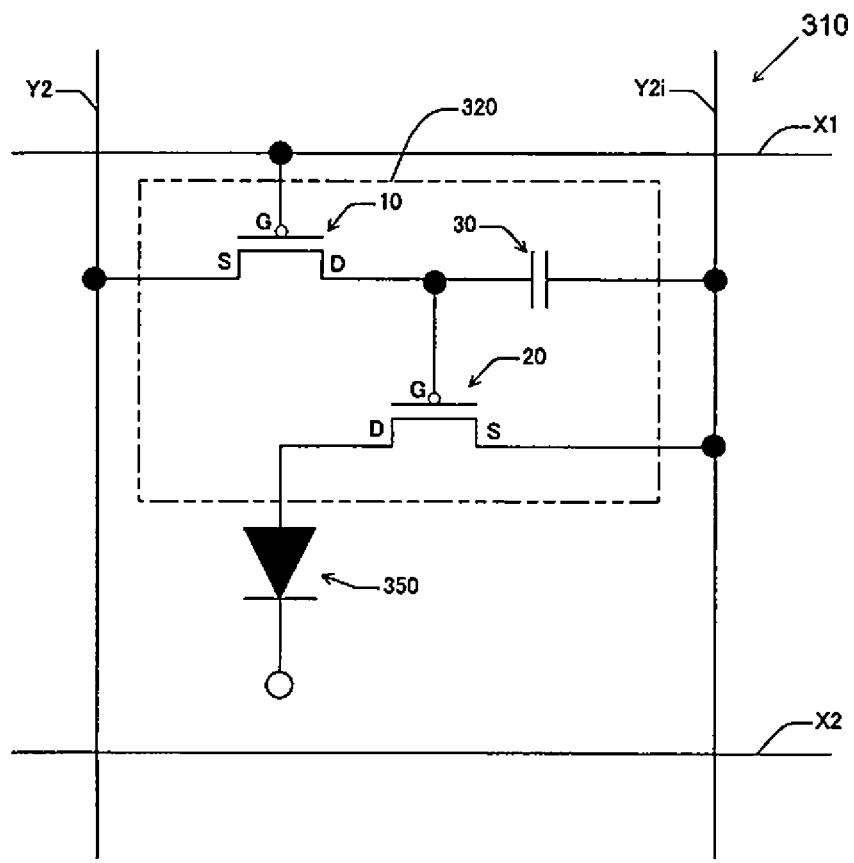
[Fig. 4]
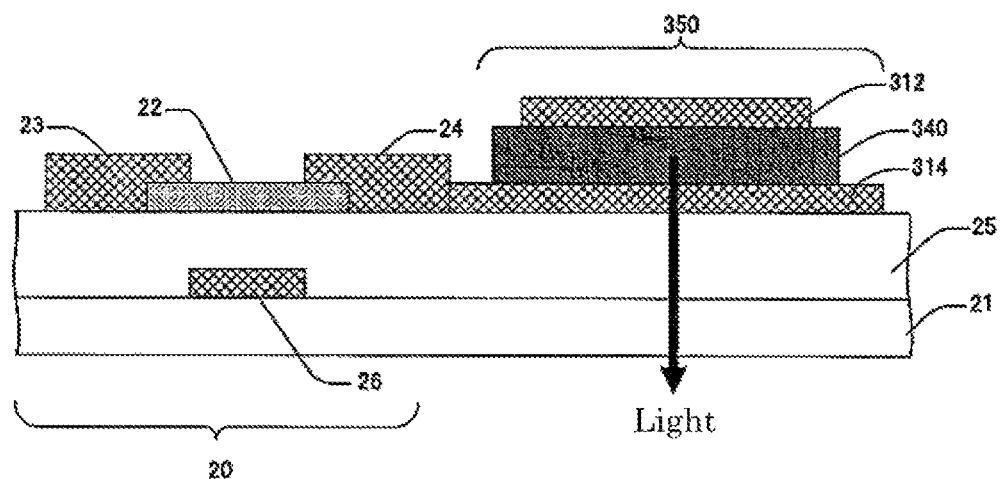

[Fig. 5]
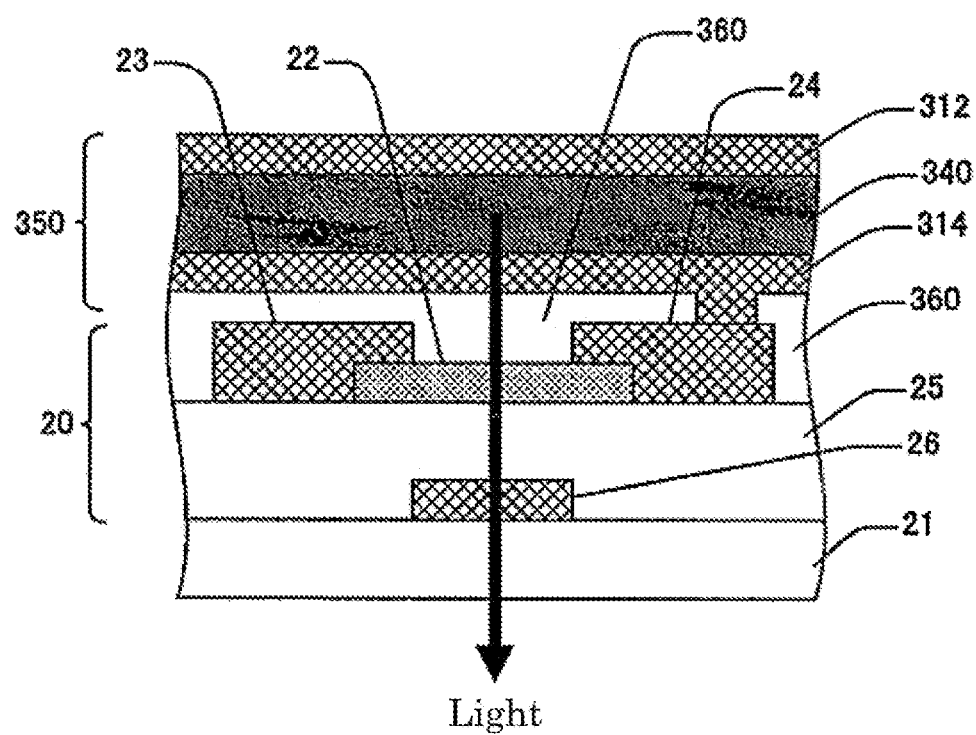
Light

[Fig. 6]
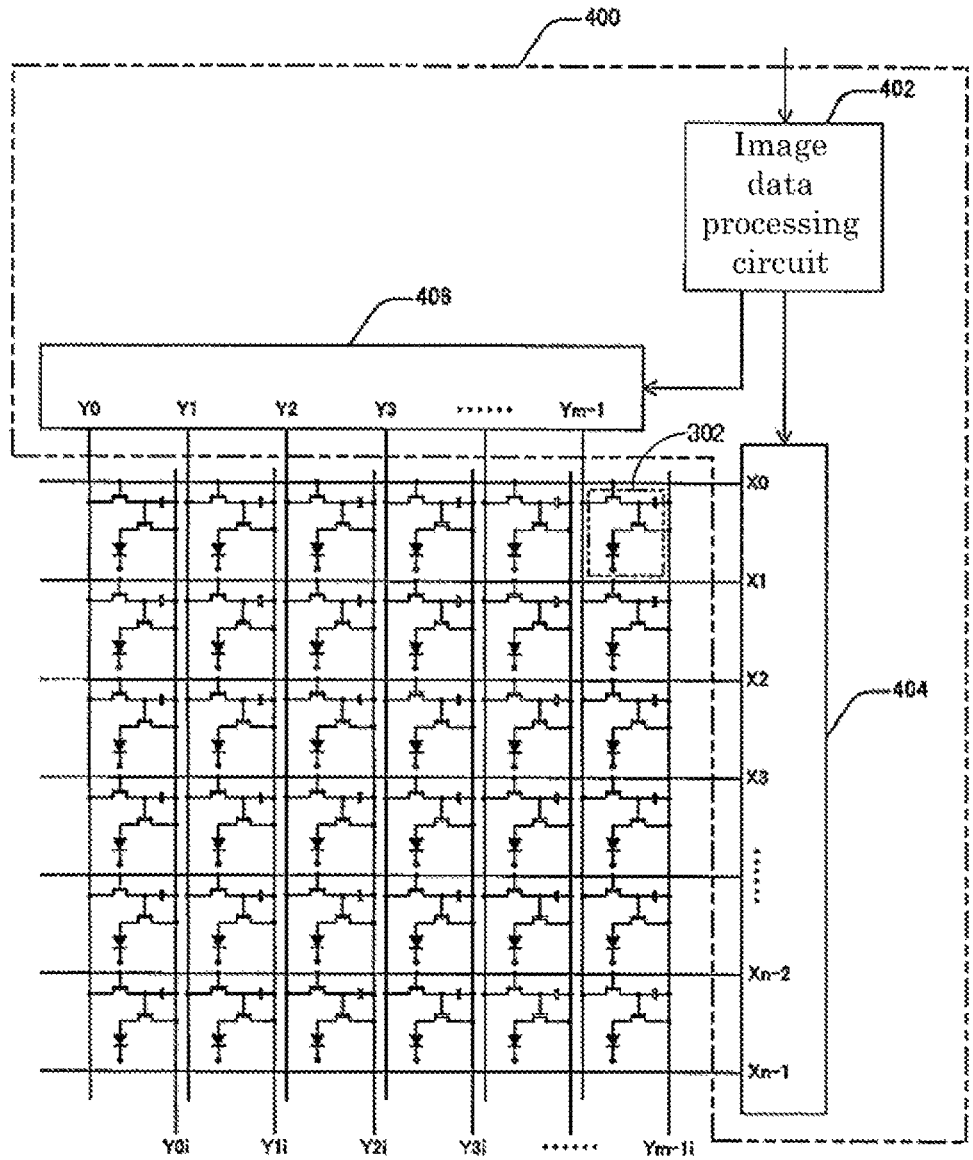
[Fig. 7]
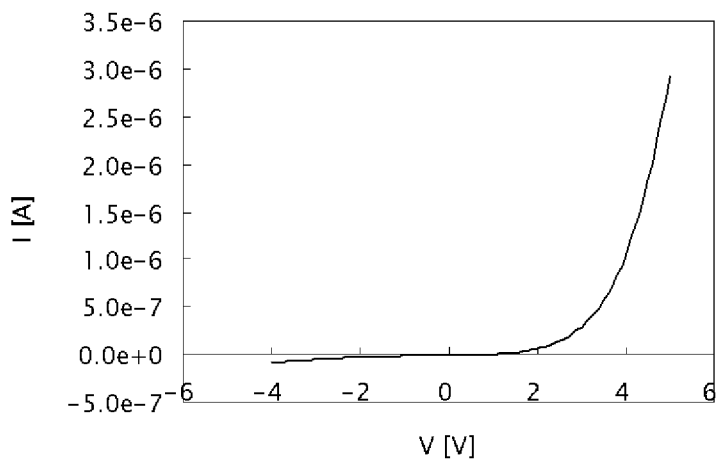

[Fig. 8]
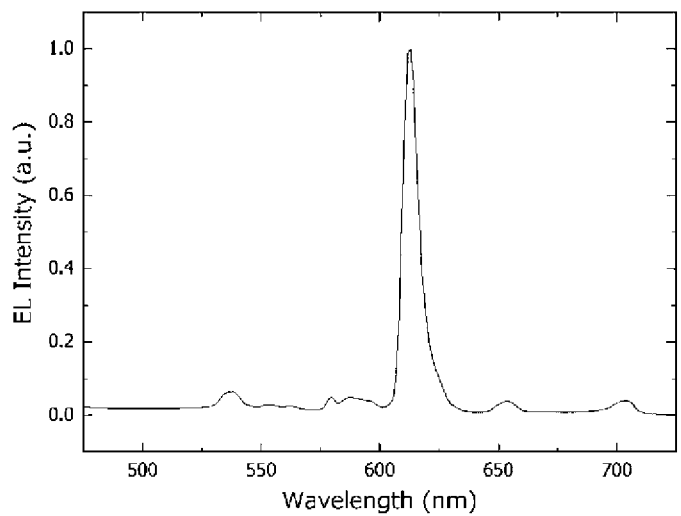
[Fig. 9]
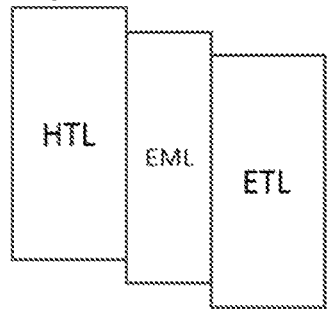
[Fig. 10]
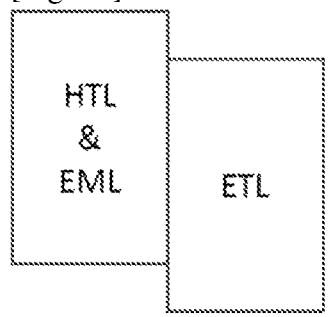
[Fig. 11]
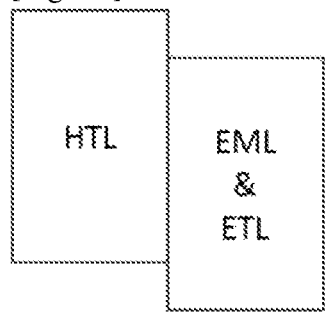

[Fig. 12]
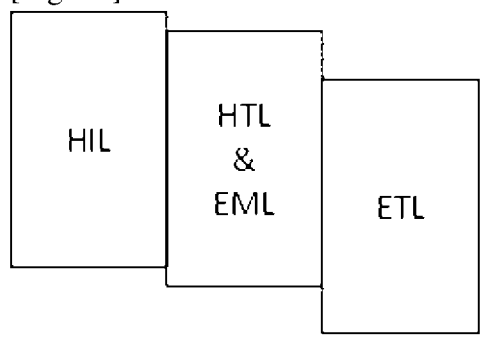
[Fig. 13]
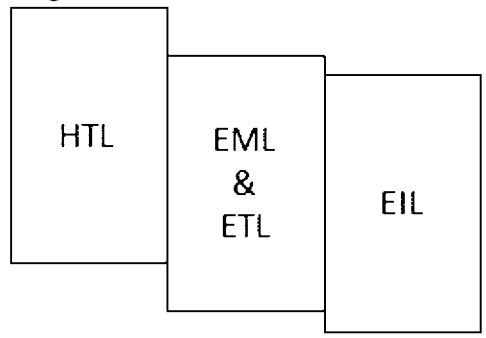

INORGANIC EL ELEMENT, DISPLAY ELEMENT, IMAGE DISPLAY DEVICE, AND SYSTEM

TECHNICAL FIELD

The present disclosure relates to a direct-current-driven inorganic EL element, a display element, an image display device, and a system.

BACKGROUND ART

In recent years, organic EL (OLED) elements or compound semiconductor LEDs are developed to be used for illumination light sources or displays. They are a current injection type light emitting element that emits light through the direct current drive and have a characteristic that light is emitted with high brightness even at a low voltage. However, the OLED is formed of an organic matter and thus has a low durability, which is a disadvantage. In addition, the LED has a disadvantage that RGB elements cannot be formed on an active matrix thin film transistor (AM-TFT) that is widely used in displays because the LED is obtained through epitaxial growth of the compound semiconductor on a single-crystal substrate. Meanwhile, an inorganic EL element formed of an oxide or oxysulphide emitting material has a high durability and has a possibility that RBG elements can be formed on an AM-TFT. Therefore, the inorganic EL element is expected as a light emitting element for the next-generation displays.

The inorganic EL elements are mainly classified into an alternating-current-driven inorganic EL element and a direct-current-driven inorganic EL element depending on the driving method. The alternating-current-driven inorganic EL element emits light by sandwiching a thin film of an inorganic light emitting layer between dielectric substance layers or applying alternating voltage of hundreds of volts to a layer in which fluorescent fine particles are dispersed in a dielectric substance binder. As a result of extensive research and development, this system has been put to practical use.

Conventionally, as the direct-current-driven inorganic EL element, a direct-current-driven inorganic EL element using an inorganic fluorescent substance, which is one kind of the EL (electroluminescence), as a light emitting layer is well known. In the direct-current-driven inorganic EL element, a light emitting layer is provided between, for example, a pair of electrodes. Voltage is applied between the pair of electrodes and the light emitting layer emits light to illuminate its surrounding. The direct-current-driven inorganic EL has advantages that the cost is low and light emission does not involve the heat generation, and is expected to prevail for the future. As the fluorescent substance of the inorganic EL element, the technique used as the direct-current-driven inorganic EL light emitting layer obtained by adding a rare earth element to zinc oxide is well known (see, for example, NPL 1).

In addition, an inorganic EL element in which a film for preventing diffusion of rare earth is provided between a light emitting layer and a substrate has been proposed (see, for example, PTL 1).

CITATION LIST

Patent Literature

PTL 1: Japanese Unexamined Patent Application Publication No. 2014-35827

Non Patent Literature

NPL 1: J. C. Ronfard-Haret, J. Kossanyi, "Electro- and photoluminescence of the Tm3+ion in Tm3+- and Li+- doped ZnO ceramics. Influence of the sintering temperature", Chem. Phys. 241 (1999) 339-349

SUMMARY OF INVENTION

Technical Problem

However, in the conventional techniques, an inorganic EL element that is driven by direct current at a low voltage and emits light at a high efficiency cannot be realized.

An object of the present disclosure is to provide a direct-current-driven inorganic EL element that sufficiently emits light at a low voltage•high efficiency.

Solution to Problem

Means for solving the aforementioned problem are as follows. That is, an inorganic EL element of the present disclosure includes: an anode; a hole transporting layer; a light emitting layer; an electron transporting layer; and a cathode, the anode, the hole transporting layer, the light emitting layer, the electron transporting layer, and the cathode being stacked. The hole transporting layer is an oxide film, the light emitting layer is an oxide film, and the electron transporting layer is an oxide film.

Advantageous Effects of Invention

According to the inorganic EL element of the present disclosure, it is possible to provide a light emitting element having durability and emitting light at a low voltage-high efficiency.

BRIEF DESCRIPTION OF DRAWINGS

FIG. 1 is a schematic structural diagram presenting one example of a direct-current-driven inorganic EL element of the present disclosure.

FIG. 2 is a diagram presenting an image display device.

FIG. 3 is a diagram presenting one example of a display element of the present disclosure.

FIG. 4 is a schematic structural diagram presenting one example of a positional relationship between an inorganic EL element and a field-effect transistor in a display element.

FIG. 5 is a schematic structural diagram presenting another example of a positional relationship between an inorganic EL element and a field-effect transistor in a display element.

FIG. 6 is a diagram presenting a display control device.

FIG. 7 is a diagram presenting an I-V characteristic of the inorganic EL element produced in Example 1.

FIG. 8 is a diagram presenting EL spectrum of the inorganic EL element produced in Example 1.

FIG. 9 is a schematic diagram presenting an energy diagram of the inorganic EL elements produced in Examples 1 and 4.

FIG. 10 is a schematic diagram presenting an energy diagram of the inorganic EL element produced in Example 2.

FIG. 11 is a schematic diagram presenting an energy diagram of the inorganic EL element produced in Example 3.

FIG. 12 is a schematic diagram presenting an energy diagram of the inorganic EL element produced in Example 5.

FIG. 13 is a schematic diagram presenting an energy diagram of the inorganic EL element produced in Example 6.

DESCRIPTION OF EMBODIMENTS (Inorganic EL Element)

An inorganic EL element of the present disclosure includes at least a light emitting layer, and further includes other components such as an anode, a cathode, a hole transporting layer, and an electron transporting layer if necessary.

The inorganic EL element is a direct-current-driven inorganic EL element.

The light emitting layer is an oxide film, preferably an amorphous oxide film.

The hole transporting layer is an oxide film, preferably an amorphous oxide film.

The electron transporting layer is an oxide film, preferably an amorphous oxide film.

The oxide film may include microcrystals.

The oxide film as the light emitting layer is preferably formed of an oxide doped with a luminescent center.

The luminescent center is preferably a transition metal ion or a rare earth ion.

The luminescent center preferably includes at least one selected from the group consisting of titanium (Ti), chromium (Cr), manganese (Mn), tungsten (W), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

In the oxide film as the light emitting layer, an oxide having a band gap energy equal to or higher than excitation energy of the luminescent center is preferably a host of the luminescent center.

In the oxide film as the light emitting layer, an oxide having a band gap energy equal to or higher than luminescent energy of the luminescent center is preferably a host of the luminescent center.

The oxide film as the hole transporting layer is preferably a p-type oxide semiconductor.

The oxide film as the electron transporting layer is preferably an n-type oxide semiconductor.

Preferably, the oxide film as the hole transporting layer is a p-type oxide semiconductor doped with a luminescent center and functions as the light emitting layer.

Preferably, the oxide film as the electron transporting layer is an n-type oxide semiconductor doped with the luminescent center and functions as the light emitting layer.

The luminescent center is preferably a transition metal ion or a rare earth ion.

The luminescent center preferably includes at least one selected from the group consisting of titanium (Ti), chromium (Cr), manganese (Mn), tungsten (W), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

FIG. 1 is a schematic structural diagram presenting one example of a direct-current-driven inorganic EL element of the present disclosure.

An inorganic EL element 350 in FIG. 1 includes a cathode 312, an anode 314, and an inorganic EL thin film layer 340.

<Cathode>

A material of the cathode 312 is not particularly limited and may be appropriately selected depending on the intended purpose. Examples of the material include aluminium (Al), magnesium (Mg)-silver (Ag) alloy, aluminium (Al)-lithium (Li) alloy, gold (Au)-germanium alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In the figure, light is taken out from the side of the anode. However, light can be taken out from the side of the cathode when the cathode is a transparent electrode or a semi-transparent electrode.

<Anode>

A material of the anode 314 is not particularly limited and may be appropriately selected depending on the intended purpose. Examples of the material include indium tin oxide (ITO), indium zinc oxide (IZO), silver (Ag)-neodymium (Nd) alloy, and aluminium (Al)-silicon (Si)-copper (Cu) alloy. Note that, in the case where a silver alloy is used, the resultant electrode becomes a high-reflective electrode, which is suitable for taking light out from the side of the cathode.

<Inorganic EL Thin Film Layer>

The inorganic EL thin film layer 340 includes, for example, an electron transporting layer 342, a light emitting layer 344, and a hole transporting layer 346. The electron transporting layer 342 is coupled to the cathode 312 and the hole transporting layer 346 is coupled to the anode 314. The light emitting layer 344 emits light when the predetermined voltage is applied between the anode 314 and the cathode 312.

The electron transporting layer 342 and the light emitting layer 344 may form a single layer. Alternatively, the hole transporting layer 346 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

A so-called "bottom emission" inorganic EL element, in which light is taken out from the side of the substrate (the bottom side in FIG. 1), is described. However, the inorganic EL element may be a "top emission" inorganic EL element, in which light is taken out from the opposite side to the substrate (the bottom side in FIG. 1).

<<Light Emitting Layer>>

The oxide film as the light emitting layer in the inorganic EL element of the present disclosure is preferably formed of an oxide doped with a luminescent center. The luminescent center is not particularly limited and may be appropriately selected from transition metal ions and rare earth ions depending on the intended purpose. Examples thereof include Ti, Cr, Mn, Cu, W, Ce, Pr, Nd, Sm, Eu, Gd, Tb, Dy, Ho, Er, Tm, and Yb.

A host oxide can be appropriately selected depending on the intended purpose, but has preferably a band gap energy equal to or higher than excitation energy of the luminescent center. Preferably, the host oxide also has a band gap energy equal to or higher than luminescent energy of the luminescent center. Specific examples of the aforementioned host oxide include $Al_2O_3$, $Ga_2O_3$, $La_2O_3$, $ZrO_2$, YAO (Yttrium Aluminium Oxide), YGO (Yttrium Gadolinium Oxide), and LAO (Lanthanum Aluminium Oxide).

A concentration of the luminescent center can be appropriately selected depending on the intended purpose. The concentration thereof is preferably 10 atom % or less, particularly preferably about 1 to 5 atom % of cations of the host.

The oxide film, which is the light emitting layer, is preferably an oxide including at least one selected from the group consisting of beryllium (Be), magnesium (Mg), calcium (Ca), strontium (Sr), barium (Ba), scandium (Sc), yttrium (Y), lanthanum (La), lutetium (Lu), boron (B), aluminium (Al), gallium (Ga), silicon (Si), germanium (Ge), antimony (Sb), bismuth (Bi), and tellurium (Te).

A film thickness of the light emitting layer can be appropriately selected depending on the intended purpose. For example, the film thickness thereof is preferably 100 nm or less, particularly preferably from about 5 nm through about 30 nm.

<<Electron Transporting Layer>>

The oxide film as the electron transporting layer in the inorganic EL element of the present disclosure is preferably formed of an n-type oxide semiconductor. A material of the n-type oxide semiconductor is not particularly limited and may be appropriately selected depending on the intended purpose. Examples thereof include InGaZnO (Indium Gallium Zinc Oxide), IMO (Indium Magnesium Oxide), ZTO (Zinc Tin Oxide), IAO (Indium Aluminium Oxide), and ILO (Indium Lanthanum Oxide). In order to control the electron carrier of the n-type oxide semiconductor, carrier doping is suitably performed.

The oxide film, which is the electron transporting layer, is preferably an n-type oxide semiconductor including at least one selected from the group consisting of zinc (Zn), cadmium (Cd), gallium (Ga), indium (In), thallium (Tl), germanium (Ge), tin (Sn), lead (Pb), bismuth (Bi), titanium (Ti), and tungsten (W).

The oxide film, which is the electron transporting layer, is preferably the n-type oxide semiconductor further including at least one selected from the group consisting of beryllium (Be), magnesium (Mg), calcium (Ca), strontium (Sr), barium (Ba), scandium (Sc), yttrium (Y), lanthanoid (Ln), boron (B), aluminium (Al), silicon (Si), antimony (Sb), and tellurium (Te).

A film thickness of the electron transporting layer can be appropriately selected depending on the intended purpose. For example, the film thickness thereof is preferably 100 nm or less, particularly preferably from about 5 nm through about 30 nm.

<<Hole Transporting Layer>>

The oxide film as the hole transporting layer in the inorganic EL element of the present disclosure is preferably formed of a p-type oxide semiconductor. A material of the p-type oxide semiconductor is not particularly limited and may be appropriately selected depending on the intended purpose. Examples thereof include $Cu_2O$, $CuInO_2$ (Copper Indium Oxide), $CuAlO_2$ (Copper Aluminium Oxide), MCO (Magnesium Copper Oxide), CCO (Calcium Copper Oxide), SCO (Strontium Copper Oxide), ACO (Antimony Copper Oxide), CTO (Copper Tin Oxide), NiO, and $ZnIr_2O_4$ (Zinc Iridium Oxide). In order to control the hole carrier of the p-type oxide semiconductor, carrier doping is suitably performed.

The oxide film, which is the hole transporting layer, is preferably a p-type oxide semiconductor including at least one selected from the group consisting of nickel (Ni), copper (Cu), zinc (Zn), ruthenium (Ru), rhodium (Rh), thallium (Tl), tin (Sn), lead (Pb), antimony (Sb), bismuth (Bi), and tellurium (Te).

A film thickness of the hole transporting layer can be appropriately selected depending on the intended purpose. For example, the film thickness thereof is preferably 100 nm or less, particularly preferably from about 5 nm through about 30 nm.

When the light emitting layer and the electron transporting layer forms a single layer, the electron transporting layer is preferably doped with a luminescent center of the light emitting layer above-mentioned.

When the light emitting layer and the hole transporting layer forms a single layer, the hole transporting layer is preferably doped with a luminescent center of the light emitting layer above-mentioned.

Combinations of, for example, a kind and concentration of the luminescent center and a material and film thickness of the electron transporting layer and the hole transporting layer can be appropriately selected.

<<Electron Injecting Layer>>

The electron injecting layer in the inorganic EL element of the present disclosure is present between the cathode and the electron transporting layer, and has a function of facilitating injection of electrons from the cathode. It is particularly useful in the case where the light emitting layer and the electron transporting layer forms a single layer as described above. An oxide film as the electron injecting layer in the inorganic EL element of the present disclosure is preferably formed of an n-type oxide semiconductor. A material of the n-type oxide semiconductor is not particularly limited and may be appropriately selected depending on the intended purpose. Examples thereof include InGaZnO (Indium Gallium Zinc Oxide), IMO (Indium Magnesium Oxide), ZTO (Zinc Tin Oxide), IAO (Indium Aluminium Oxide), and ILO (Indium Lanthanum Oxide).

The oxide film as the electron injecting layer is preferably an n-type oxide semiconductor including at least one selected from the group consisting of zinc (Zn), cadmium (Cd), gallium (Ga), indium (In), thallium (Tl), germanium (Ge), tin (Sn), lead (Pb), bismuth (Bi), titanium (Ti), and tungsten (W).

The n-type oxide semiconductor as the electron injecting layer suitably undergoes carrier doping in order to lower injection barrier of electrons from the cathode. As a carrier dopant, an element having a higher valence than that of the constituent element of the n-type oxide semiconductor is preferably added. For IMO (Indium Magnesium Oxide), for example, tin (Sn), titanium (Ti), niobium (Nb), and tungsten (W) are preferable. For ZTO (Zinc Tin Oxide), for example, niobium (Nb), molybdenum (Mo), and tungsten (W) are preferable.

A film thickness of the electron injecting layer can be appropriately selected depending on the intended purpose. For example, the film thickness thereof is preferably 100 nm or less, particularly preferably from about 5 nm through about 30 nm.

<<Hole Injecting Layer>>

The hole injecting layer in the inorganic EL element of the present disclosure is present between the anode and the hole transporting layer, and has a function of facilitating injection of holes from the anode. It is particularly useful in the case where the light emitting layer and the hole transporting layer forms a single layer as described above. An oxide film as the hole injecting layer in the inorganic EL element of the present disclosure is preferably formed of a p-type oxide semiconductor. A material of the p-type oxide semiconductor is not particularly limited and may be appropriately selected depending on the intended purpose. Examples thereof include $Cu_2O$, $CuInO_2$ (Copper Indium Oxide), $CuAlO_2$ (Copper Aluminium Oxide), MCO (Magnesium Copper Oxide), CCO (Calcium Copper Oxide), SCO (Strontium Copper Oxide), ACO (Antimony Copper Oxide), CTO (Copper Tin Oxide), NiO, and $ZnIr_2O_4$ (Zinc Iridium Oxide).

The oxide film as the hole injecting layer is preferably a p-type oxide semiconductor including at least one selected from the group consisting of nickel (Ni), copper (Cu), zinc (Zn), ruthenium (Ru), rhodium (Rh), thallium (Tl), tin (Sn), lead (Pb), antimony (Sb), bismuth (Bi), and tellurium (Te).

The p-type oxide semiconductor as the hole injecting layer suitably undergoes carrier doping in order to lower injection barrier of holes from the anode. As a carrier dopant, an element having a lower valence than that of the constituent element of the p-type oxide semiconductor is preferably added. For $CuInO_2$ (Copper Indium Oxide), for example, magnesium (Mg), calcium (Ca), and strontium (Sr) are preferable.

A film thickness of the hole transporting layer can be appropriately selected depending on the intended purpose. For example, the film thickness thereof is preferably 100 nm or less, particularly preferably from about 5 nm through about 30 nm.

A method for forming a film of the inorganic EL thin film layer is not particularly limited and may be appropriately selected depending on the intended purpose. Examples thereof include the vacuum methods of the film formation (e.g., the CVD method and the ALD method) and the printing methods such as the spin coating method and the slit die coating method.

A sealing film or other components can be appropriately selected depending on the intended purpose.

A substrate is not particularly limited and may be appropriately selected depending on the intended purpose. Examples thereof include a glass substrate and a plastic substrate.

A method of film formation of electrode layers (anode and cathode) is not particularly limited and may be appropriately selected depending on the intended purpose. Examples thereof include the vacuum methods of the film formation (e.g., the sputtering method, the CVD method, and the vacuum vapor deposition method), and the printing methods such as the spin coating method, and the slit die coating method.

<Production Method of Inorganic EL Element>

A method for producing the inorganic EL element is not particularly limited and may be appropriately selected depending on the intended purpose. The method for producing the inorganic EL element includes, for example, a step of forming the inorganic EL thin film layer using a coating liquid for forming inorganic EL thin film, and further includes other steps if necessary.

Note that, the coating liquid for forming inorganic EL thin film is a coating liquid for forming at least one of the hole transporting layer, the light emitting layer, and the electron transporting layer, which constitute the inorganic EL thin layer.

—Coating Liquid for Forming Inorganic EL Thin Film—

The coating liquid for forming inorganic EL thin film is preferably obtained by dissolving, in a solvent, a metal element constituting a light emitting layer, a p-type oxide semiconductor, and n-type oxide semiconductor in the form of at least one selected from the group consisting of an oxide, an inorganic salt, a carboxylate, an organic compound, and an organometallic. The oxide, the inorganic salt, the carboxylate, the organic compound, or the organometallic may homogeneously be dissolved in the solvent and may be dissociated to form ions. When the oxide, the inorganic salt, the carboxylate, the organic compound, or the organometallic is dissolved in the coating liquid for forming inorganic EL thin film, segregation of the concentration in the coating liquid for forming inorganic EL thin film hardly occurs. Therefore, the coating liquid for forming inorganic EL thin film can be used for a long period of time. Moreover, a thin film prepared using this coating liquid also has a uniform formulation. Therefore, when the coating liquid is used in the inorganic EL thin film, uniformity of properties is also favorable.

Preferable examples of material of the luminescent center constituting a coating liquid for forming light emitting layer that is one example of the coating liquid for forming inorganic EL thin film include transition metal compounds including, for example, titanium (Ti), chromium (Cr), manganese (Mn), and tungsten (W), and rare earth metal compounds including, for example, cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

Hereinafter, the aforementioned compounds, each of which are the material of the luminescent center constituting the coating liquid for forming light emitting layer, will be exemplified.

<<Manganese (Mn)—Including Compound>>

The manganese (Mn)-including compound is not particularly limited and may be appropriately selected depending on the intended purpose. Examples thereof include organic manganese compounds and inorganic manganese compounds.

—Organic Manganese Compound—

The organic manganese compound is not particularly limited and may be appropriately selected depending on the intended purpose, so long as it is a compound including manganese and an organic group. The manganese and the organic group are bound via, for example, an ionic bond, a covalent bond, or a coordination bond.

The organic group is not particularly limited and may be appropriately selected depending on the intended purpose. Examples of the organic group include alkoxy groups that may have a substituent, acyloxy groups that may have a substituent, and acetylacetonato groups that may have a substituent. Examples of the alkoxy groups include alkoxy groups including 1 through 6 carbon atoms. Examples of the acyloxy groups include acyloxy groups including 1 through 10 carbon atoms.

Examples of the substituent include halogen and a tetrahydrofuryl group.

Examples of the organic manganese compound include manganese(II) acetate tetrahydrate, manganese(II) benzoate tetrahydrate, manganese(III) acetylacetonato, and manganese(II) 2-ethylhexanoate.

—Inorganic Manganese Compound—

The inorganic manganese compound is not particularly limited and may be appropriately selected depending on the intended purpose. Examples thereof include manganese oxoacids, manganese halides, and manganese oxides.

Examples of the manganese oxoacids include manganese nitrate, manganese sulfate, and manganese carbonate.

Examples of the manganese halides include manganese fluoride, manganese chloride, manganese bromide, and manganese iodide.

Among them, manganese(II) nitrate tetrahydrate and manganese(II) chloride tetrahydrate are more preferable in terms of high solubility to various solvents.

As these manganese-including compounds, a synthesized product may be used, or a commercially available product may be used.

<<Europium (Eu)-Including Compound>>
The europium (Eu)—including compound is not particularly limited and may be appropriately selected depending on the intended purpose. Examples thereof include organic europium compounds and inorganic europium compounds.

—Organic Europium Compound—

The organic europium compound is not particularly limited and may be appropriately selected depending on the intended purpose, so long as it is a compound including europium and an organic group. The europium and the organic group are bound via, for example, an ionic bond, a covalent bond, or a coordination bond.

The organic group is not particularly limited and may be appropriately selected depending on the intended purpose. Examples of the organic group include alkoxy groups that may have a substituent, acyloxy groups that may have a substituent, and acetylacetonato groups that may have a substituent. Examples of the alkoxy groups include alkoxy groups including 1 through 6 carbon atoms. Examples of the acyloxy groups include acyloxy groups including 1 through 10 carbon atoms.

Examples of the substituent include halogen and a tetrahydrofuryl group.

Examples of the organic europium compound include europium(III) acetate hydrate, europium(III) acetylacetonato hydrate, and europium(III) 2-ethylhexanoate.

—Inorganic Europium Compound—

The inorganic europium compound is not particularly limited and may be appropriately selected depending on the intended purpose. Examples thereof include europium oxoacids, europium halides, and europium oxides.

Examples of the europium oxoacids include europium nitrate, europium sulfate, and europium carbonate.

Examples of the europium halides include europium fluoride, europium chloride, europium bromide, and europium iodide.

Among them, europium(III) nitrate hexahydrate, europium(III) chloride hexahydrate, and europium(III) sulfate octahydrate are more preferable in terms of high solubility to various solvents.

As these europium-including compounds, a synthesized product may be used, or a commercially available product may be used.

As described above, the compounds including manganese (Mn) and the compounds including europium (Eu) are described in detail.

The same description is also applicable to, for example, titanium (Ti), chromium (Cr), copper (Cu), tungsten (W), cerium (Ce), praseodymium (Pr), neodymium (Nd), samarium (Sm), gadolinium (Gd), terbium (Tb), dysprosium (Dy), holmium (Ho), erbium (Er), thulium (Tm), and ytterbium (Yb).

The same description is also applicable to, for example, beryllium (Be), magnesium (Mg), calcium (Ca), strontium (Sr), barium (Ba), scandium (Sc), yttrium (Y), lanthanum (La), lutetium (Lu), boron (B), aluminium (Al), gallium (Ga), silicon (Si), germanium (Ge), antimony (Sb), bismuth (Bi), and tellurium (Te), which constitute one example of the light emitting layer.

The same description is also applicable to, for example, nickel (Ni), copper (Cu), zinc (Zn), ruthenium (Ru), rhodium (Rh), thallium (Tl), tin (Sn), lead (Pb), antimony (Sb), bismuth (Bi), and tellurium (Te), which constitute one example of the hole transporting layer.

The same description is also applicable to, for example, zinc (Zn), cadmium (Cd), gallium (Ga), indium (In), thallium (Tl), germanium (Ge), tin (Sn), lead (Pb), bismuth (Bi), titanium (Ti), and tungsten (W), which constitute one example of the electron transporting layer.

(Display Element)

A display element of the present disclosure includes at least an optical control element and a driving circuit configured to drive the optical control element. The display element further includes other components if necessary.

<Optical Control Element>

The optical control element is an element configured to control light output according to a driving signal and may include other kinds of optical control elements so long as the other kinds of optical control elements include the inorganic EL element of the present disclosure. The other kinds of optical control elements are not particularly limited and may be appropriately selected depending on the intended purpose. Examples thereof include organic electroluminescent (EL) elements, electrochromic (EC) elements, liquid crystal elements, electrophoretic elements, and electrowetting elements.

<Driving Circuit>

The driving circuit is not particularly limited and may be appropriately selected depending on the intended purpose. The driving circuit preferably includes a field-effect transistor such as a thin film transistor (TFT) containing an a-Si, LTPS, or an oxide semiconductor as an active layer.

<Other Components>

The other components are not particularly limited and may be appropriately selected depending on the intended purpose.

The display element of the present invention includes the inorganic EL element of the present disclosure. Therefore, the display element emits light at a low voltage and a high efficiency and realizes long lifetime because of less change over time.

(Image Display Device)

An image display device of the present disclosure includes at least a plurality of display elements, a plurality of wired lines, and a display control device. The image display device further includes other components if necessary.

<Display Element>

The display element is not particularly limited and may be appropriately selected depending on the intended purpose, so long as the display element is the display element of the present disclosure arranged in a form of matrix.

<Wired Line>

The wired line is not particularly limited and may be appropriately selected depending on the intended purpose, so long as it is possible to individually apply gate voltage and image data signal to the field-effect transistors in the plurality of display elements.

<Display Control Device>

The display control device is not particularly limited and may be appropriately selected depending on the intended purpose, so long as it is possible to individually control the gate voltage and the signal voltage of the field-effect transistors via the plurality of wired lines correspondingly to the image data.

<Other Components>

The other components are not particularly limited and may be appropriately selected depending on the intended purpose.

An image display device of the present disclosure includes the display element of the present disclosure. Therefore, the image display device has long lifetime and is stably driven.

The image display device of the present disclosure can be used as a display unit in mobile information devices (e.g., mobile phones, portable music players, portable video players, electronic books, and personal digital assistants (PDAs)) and camera devices (e.g., still cameras and video cameras). The image display device can also be used for display units of various pieces of information in transportation systems (e.g., cars, aircraft, trains, and ships). Furthermore, the image display device can be used for display units of various pieces of information in measuring devices, analysis devices, medical equipment, and advertising media.

(System)

A system of the present disclosure includes at least the image display device of the present disclosure and an image-data-generating device.

The image-data-generating device is configured to generate image data based on image information to be displayed and to output the image data to the image display device.

Because the system of the present disclosure includes the image display device of the present disclosure, image information with high definition can be displayed.

The image display device of the present disclosure will next be described hereinafter. The image display device of the present disclosure can be obtained by employing, for example, configurations described in paragraphs 0059 to 0060 and FIGS. 2 and 3 of Japanese Unexamined Patent Application Publication No. 2010-074148.

One example of the embodiment of the present disclosure will next be described with reference to the figures.

FIG. 2 is a diagram presenting a display in which display elements are arranged in a form of matrix. As presented in FIG. 2, the display includes "n" scanning lines (X0, X1, X2, X3, . . . Xn-2, Xn-1) arranged along the X axis direction at constant intervals, "m" data lines (Y0, Y1, Y2, Y3, . . . Ym-1) arranged along the Y axis direction at constant intervals, and "m" current supply lines (Y0$i$, Y1$i$, Y2$i$, Y3$i$, . . . Ym-1$i$) arranged along the Y axis direction at constant intervals. Here, meanings of reference numerals (for example, X1 and Y1) are in common throughout FIGS. 3 and 6.

Therefore, the display element 302 can be identified by the scanning lines and the data lines.

FIG. 3 is a schematic structural diagram presenting one example of the display element of the present disclosure.

As presented as one example in FIG. 3, the display element includes an inorganic electroluminescent (EL) element 350 and a drive circuit 320 configured to allow the inorganic EL element 350 to emit light. That is, a display 310 is an inorganic EL display of a so-called active matrix system. Moreover, the display 310 is a 55-inch display adaptable to colors. A size of the display 310 is not limited to 55 inches.

The drive circuit 320 in FIG. 3 will be described.

The drive circuit 320 includes two field-effect transistors 10 and 20 and a capacitor 30.

A field-effect transistor 10 serves as a switching element. A gate electrode G of the field-effect transistor 10 is coupled to a predetermined scanning line and a source electrode S of the field-effect transistor 10 is coupled to a predetermined data line. Moreover, a drain electrode D of the field-effect transistor 10 is coupled to one terminal of the capacitor 30.

The field-effect transistor 20 is configured to supply electric current to the inorganic EL element 350. The gate electrode G of the field-effect transistor 20 is coupled to the drain electrode D of the field-effect transistor 10. The drain electrode D of the field-effect transistor 20 is coupled to the anode of the inorganic EL element 350 and a source electrode S of the field-effect transistor 20 is coupled to a predetermined current supply line.

The capacitor 30 is configured to memorize the state of the field-effect transistor 10; i.e., data. The other terminal of the capacitor 30 is coupled to a predetermined current supply line.

When the field-effect transistor 10 turns into the state of "on", image data are stored in the capacitor 30 via the signal line Y2. Even after the field-effect transistor 10 turns into the state of "off", the inorganic EL element 350 is driven by maintaining the "on" state of the field-effect transistor 20 corresponding to the image data.

FIG. 4 presents one example of a positional relationship between an inorganic EL element 350 and a field-effect transistor 20 serving as a drive circuit in a display element. Here, the inorganic EL element 350 is disposed next to the field-effect transistor 20. Note that, a field-effect transistor and a capacitor (not illustrated) are also formed on the same substrate.

A passivation film is suitably disposed on or above the active layer 22, although the passivation film is not illustrated in FIG. 4. As a material of the passivation film, $SiO_2$, SiNx, $Al_2O_3$, and fluoropolymers may be appropriately used.

As presented in FIG. 5, for example, the inorganic EL element 350 may be disposed on the field-effect transistor 20. In the case of this structure, the gate electrode 26 is required to have transparency. Therefore, a conductive transparent oxide (e.g., ITO, $In_2O_3$, $SnO_2$, ZnO, Ga-doped ZnO, Al-doped ZnO, and Sb-doped $SnO_2$) is used for the gate electrode 26. Note that, the reference numeral 360 is an interlayer insulating film (a leveling film). Polyimide or acrylic resins can be used for the insulating film.

In FIGS. 4 and 5, the field-effect transistor 20 includes a substrate 21, an active layer 22, a source electrode 23, a drain electrode 24, a gate insulating layer 25, and a gate electrode 26. An inorganic EL element 350 includes a cathode 312, an anode 314, and an inorganic EL thin film layer 340.

FIG. 6 is a schematic structural diagram presenting another example of the image display device of the present disclosure.

In FIG. 6, the image display device includes display elements 302, wired lines (including scanning lines, data lines, and current supply lines), and a display control device 400.

The display control device 400 includes an image-data-processing circuit 402, a scanning-line-driving circuit 404, and a data-line-driving circuit 406.

The image-data-processing circuit 402 determines brightness of a plurality of display elements 302 in the display based on output signals of an image output circuit.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

As described above, the case where the system of the present disclosure is a television device has been described. However, the system of the present disclosure is not limited to the television device. The system is not particularly limited, so long as the system includes the image display device serving as a device configured to display images and information. For example, the system may be a computer system in which a computer (including a personal computer) is coupled to the image display device.

A system of the present disclosure includes the display element of the present disclosure. Therefore, the system has long lifetime and is stably driven.

EXAMPLES

The present disclosure will next be described by way of Examples, but the present disclosure should not be construed as being limited to these Examples.

Production Example 1-1

<Preparation of Coating Liquid for Forming Light Emitting Layer>
Lanthanum 2-ethylhexanoate (50 mmol) and europium 2-ethylhexanoate (2 mmol) were weighed. Then, they were mixed with 2-ethylhexanoic acid (octylic acid) (1,000 mL) at room temperature to be dissolved to prepare a coating liquid for forming light emitting layer (coating liquid 1-1).

Production Example 2-1

<Preparation of Coating Liquid for Forming Electron Transporting Layer>
Zinc acetate dehydrate (10 mmol), gallium nitrate octahydrate (10 mmol), and indium nitrate trihydrate (10 mmol) were each weighed. Then, they were mixed with ethylene glycol monomethyl ether (300 mL), propylene glycol (300 mL), and ethanol (300 mL) at room temperature to be dissolved to prepare a coating liquid for forming electron transporting layer (coating liquid 2-1).

Production Example 3-1

<Preparation of Coating Liquid for Forming Hole Transporting Layer>
Copper nitrate trihydrate (25 mmol) and magnesium nitrate hexahydrate (25 mmol) were weighed. Then, they were mixed with ethylene glycol monomethyl ether (400 mL), propylene glycol (400 mL), and ethanol (400 mL) at room temperature to be dissolved to prepare a coating liquid for forming hole transporting layer (coating liquid 3-1).

Example 1

<Preparation of Inorganic EL Element>
On an alkali-free glass substrate (with patterning ITO electrode film 100 nm) that had been subjected to UV ozone cleaning, the coating liquid 3-1 was printed using a spin coating device. The substrate was dried using a hot plate at 120 degrees Celsius for 3 minutes and was baked at 400 degrees Celsius for 1 hour in the atmosphere to obtain a hole transporting layer having a thickness of 40 nm.

The substrate was further subjected to UV ozone cleaning. Then, the coating liquid 1-1 was printed thereon using a spin coating device. The substrate was dried using a hot plate at 120 degrees Celsius for 3 minutes and was baked at 400 degrees Celsius for 1 hour in the atmosphere to stack a light emitting layer having a thickness of 20 nm.

The substrate was further subjected to UV ozone cleaning. Then, the coating liquid 2-1 was printed thereon using a spin coating device. The substrate was dried using a hot plate at 120 degrees Celsius for 3 minutes and was baked at 400 degrees Celsius for 1 hour in the atmosphere to stack an electron transporting layer having a thickness of 40 nm.

Finally, aluminium was used to form a film using vacuum vapor deposition through a metal mask to stack an Al cathode having a thickness of 100 nm.

<Evaluation>

The inorganic EL element produced in Example 1 was measured for luminescence characteristics.

When direct voltage was applied between the electrodes, the voltage-current characteristic as presented in FIG. 7 was exhibited. In addition, favorable red luminescence characteristic of europium was exhibited at 4 V.

Note that, in FIG. 7, "e" denotes the exponent of 10. Specifically, "e-6" denotes "$10^{-6}$".

In addition, the inorganic EL element produced in Example 1 was measured for EL spectrum. Results were presented in FIG. 8.

Production Example 1-2 to Production Example 1-6

<Preparation of Coating Liquid for Forming Light Emitting Layer>
Each coating liquid for forming light emitting layer (coating liquid 1-2 to coating liquid 1-6) was prepared in the same manner as in Production Example 1-1 except that the materials in Production Example 1-1 were changed to materials described in Table 1.

TABLE 1

| Production Example | Coating liquid No | Material A Compound | mmol | Material B Compound | mmol | Material C Compound | mmol |
|---|---|---|---|---|---|---|---|
| 1-1 | 1-1 | $La(C_8H_{15}O_2)_3$ | 50 | | | $Eu(C_8H_{15}O_2)_3$ | 2 |
| 1-2 | 1-2 | $Y(NO_3)_3 \cdot 6H_2O$ | 50 | | | $Tb(NO_3)_3 \cdot 6H_2O$ | 3 |
| 1-3 | 1-3 | $Al(NO_3)_3 \cdot 9H_2O$ | 40 | $Mg(NO_3)_2 \cdot 6H_2O$ | 20 | $EuCl_3 \cdot 6H_2O$ | 5 |
| 1-4 | 1-4 | $LaCl_3 \cdot 7H_2O$ | 80 | $CaCl_2 \cdot 2H_2O$ | 20 | $W(CO)_6$ | 2 |
| 1-5 | 1-5 | $AlCl_3 \cdot 6H_2O$ | 100 | | | $CrCl_3 \cdot 6H_2O$ | 1 |
| 1-6 | 1-6 | $La(NO_3)_3 \cdot 6H_2O$ | 45 | $SrCl_2 \cdot 6H_2O$ | 5 | $Tm(NO_3)_3 \cdot 6H_2O$ | 2 |

| Production Example | Coating liquid No | Solvent D Compound | mL | Solvent E Compound | mL | Solvent F Compound | mL |
|---|---|---|---|---|---|---|---|
| 1-1 | 1-1 | Octylic acid | 1000 | | | | |
| 1-2 | 1-2 | EGME | 300 | EG | 300 | MeOH | 400 |

TABLE 1-continued

|  |  |  |  |  |  |  |  |
|---|---|---|---|---|---|---|---|
| 1-3 | 1-3 | PGME | 300 | PG | 300 | EtOH | 400 |
| 1-4 | 1-4 | DMF | 600 | PG | 800 | MeOH | 800 |
| 1-5 | 1-5 | EGIPE | 600 | PG | 800 | IPA | 600 |
| 1-6 | 1-6 | EGME | 300 | EG | 300 | $H_2O$ | 400 |

Production Example 2-2 to Production Example 2-4

<Preparation of Coating Liquid for Forming Electron Transporting Layer>

Each coating liquid for forming electron transporting layer (coating liquid 2-2 to coating liquid 2-4) was prepared in the same manner as in Production Example 2-1 except that the materials in Production Example 2-1 were changed to materials described in Table 2.

TABLE 2

| Production Example | Coating liquid No | Material A Compound | mmol | Material B Compound | mmol | Material C Compound | mmol |
|---|---|---|---|---|---|---|---|
| 2-1 | 2-1 | $Zn(CH_3COO)_2 \cdot 2H_2O$ | 10 | $Ga(NO_3)_3 \cdot 8H_2O$ | 10 | | |
|  |  |  |  | $In(NO_3)_3 \cdot 3H_2O$ | 10 | | |
| 2-2 | 2-2 | $Zn(NO_3)_2 \cdot 6H_2O$ | 120 | $SnCl_4 \cdot 5H_2O$ | 60 | | |
| 2-3 | 2-3 | $Mg(NO_3)_2 \cdot 6H_2O$ | 80 | $In(NO_3)_3 \cdot 3H_2O$ | 115 | $Tb(NO_3)_3 \cdot 6H_2O$ | 5 |
| 2-4 | 2-4 | $La(NO_3)_2 \cdot 6H_2O$ | 10 | $In(NO_3)_3 \cdot 3H_2O$ | 165 | $TmCl_3 \cdot 7H_2O$ | 5 |

| Production Example | Coating liquid No | Solvent D Compound | mL | Solvent E Compound | mL | Solvent F Compound | mL |
|---|---|---|---|---|---|---|---|
| 2-1 | 2-1 | EGME | 300 | PG | 300 | EtOH | 300 |
| 2-2 | 2-2 | EGIPE | 300 | EG | 300 | MeOH | 300 |
| 2-3 | 2-3 | PGME | 300 | EG | 300 | IPA | 300 |
| 2-4 | 2-4 | EGME | 300 | EG | 300 | H2O | 300 |

Production Example 3-2 to Production Example 3-4

<Preparation of Coating Liquid for Forming Hole Transporting Layer>

Each coating liquid for forming hole transporting layer (coating liquid 3-2 to coating liquid 3-4) was prepared in the same manner as in Production Example 3-1 except that the materials in Production Example 3-1 were changed to materials described in Table 3.

TABLE 3

| Production Example | Coating liquid No | Material A Compound | mmol | Material B Compound | mmol | Material C Compound | mmol |
|---|---|---|---|---|---|---|---|
| 3-1 | 3-1 | $Cu(NO_3)_2 \cdot 3H_2O$ | 25 | $Mg(NO_3)_2 \cdot 6H_2O$ | 25 | | |
| 3-2 | 3-2 | $Cu(C_{10}H_{19}O_2)_2$ | 60 | $Sn(C_8H_{15}O_2)_2$ | 60 | | |
| 3-3 | 3-3 | $Tl(C_8H15O_2)$ | 60 | $Bi(C_8H_{15}O_2)_3$ | 60 | $Cr(C_8H_{15}O_2)_3$ | 1 |
| 3-4 | 3-4 | $CuCl_2 \cdot 2H_2O$ | 60 | $BaCl_2 \cdot 2H_2O$ | 80 | $TbCl_3 \cdot 6H_2O$ | 5 |

| Production Example | Coating liquid No | Solvent D Compound | mL | Solvent E Compound | mL | Solvent F Compound | mL |
|---|---|---|---|---|---|---|---|
| 3-1 | 3-1 | EGME | 400 | PG | 400 | EtOH | 400 |
| 3-2 | 3-2 | Toluene | 300 | CHB | 300 | | |
| 3-3 | 3-3 | Xylene | 300 | CHB | 300 | | |
| 3-4 | 3-4 | EGIPE | 300 | EG | 300 | MeOH | 300 |

Production Example 4-1 to Production Example 4-2

<Preparation of Coating Liquid for Forming Hole Injecting Layer and Coating Liquid for Forming Electron Injecting Layer>

A coating liquid for forming hole injecting layer (coating liquid 4-1) and a coating liquid for forming electron injecting layer (coating liquid 4-2) were prepared in the same manner as in Production Example 1-1 except that the materials in Production Example 1-1 were changed to materials described in Table 4.

TABLE 4

| Production Example | Coating liquid No | Material A Compound | mmol | Material B Compound | mmol | Material C Compound | mmol |
|---|---|---|---|---|---|---|---|
| 4-1 | 4-1 | $Cu(C_{10}H_{19}O_2)_2$ | 160 | $Ca(C_8H_{15}O_2)_2$ | 40 | — | — |
| 4-2 | 4-2 | $Cd(NO_3)_2 \cdot 2H_2O$ | 80 | $InCl_3 \cdot 4H_2O$ | 115 | $SnCl_4 \cdot 5H_2O$ | 5 |

| Production Example | Coating liquid No | Solvent D Compound | mL | Solvent E Compound | mL | Solvent F Compound | mL |
|---|---|---|---|---|---|---|---|
| 4-1 | 4-1 | Toluene | 400 | CHB | 400 | | |
| 4-2 | 4-2 | EGME | 300 | PG | 300 | MeOH | 300 |

The materials in Table 1 to Table 4 are as follows.
<Table 1·material A>
$La(C_8H_{15}O_2)_3$: Lanthanum 2-ethylhexanoate
$Y(NO_3)_3 \cdot 6H_2O$: Yttrium nitrate hexahydrate
$Al(NO_3)_3 \cdot 9H_2O$: Aluminium nitrate nonahydrate
$LaCl_3 \cdot 7H_2O$: Lanthanum chloride heptahydrate
$AlCl_3 \cdot 6H_2O$: Aluminium chloride hexahydrate
$La(NO_3)_3 \cdot 6H_2O$: Lanthanum nitrate hexahydrate
<Table 1.material B>
$Mg(NO_3)_2 \cdot 6H_2O$: Magnesium nitrate hexahydrate
$CaCl_2 \cdot 2H_2O$: Calcium chloride dehydrate
$SrCl_2 \cdot 6H_2O$: Strontium chloride hexahydrate
<Table 1.material C>
$Eu(C_8H_{15}O_2)_3$: Europium 2-ethylhexanoate
$Tb(NO_3)_3 \cdot 6H_2O$: Terbium nitrate hexahydrate
$EuCl_3 \cdot 6H_2O$: Europium chloride hexahydrate
$W(CO)_6$: Tungsten carbonyl
$CrCl_3 \cdot 6H_2O$: Chromium chloride hexahydrate
$Tm(NO_3)_3 \cdot 6H_2O$: Thulium nitrate hexahydrate
<Table 2.material A>
$Zn(CH_3COO)_2 \cdot 2H_2O$: Zinc acetate dehydrate
$Zn(NO_3)_2 \cdot 6H_2O$: Zinc nitrate hexahydrate
$Mg(NO_3)_2 \cdot 6H_2O$: Magnesium nitrate hexahydrate
$La(NO_3)_2 \cdot 6H_2O$: Lanthanum nitrate hexahydrate
<Table 2. material B>
$Ga(NO_3)_3 \cdot 8H_2O$: Gallium nitrate octahydrate
$In(NO_3)_3 \cdot 3H_2O$: Indium nitrate trihydrate
$SnCl_4 \cdot 5H_2O$: Tin chloride pentahydrate
<Table 2.material C>
$Tb(NO_3)_3 \cdot 6H_2O$: Terbium nitrate hexahydrate
$TmCl_3 \cdot 7H_2O$: Thulium chloride heptahydrate
<Table 3.material A>
$Cu(NO_3)_2 \cdot 3H_2O$: Copper nitrate trihydrate
$Cu(C_{10}H_{19}O_2)_2$: Copper neodecanoate
$Tl(C_8H_{15}O_2)$: Thallium 2-ethylhexanoate
$CuCl_2 \cdot 2H_2O$: Copper chloride dehydrate
<Table 3.material B>
$Mg(NO_3)_2 \cdot 6H_2O$: Magnesium nitrate hexahydrate
$Sn(C_8H_{15}O_2)_2$: Tin 2-ethylhexanoate
$Bi(C_8H_{15}O_2)_3$: Bismuth tris(2-ethylhexanoate)
$BaCl_2 \cdot 2H_2O$: Barium chloride dehydrate
<Table 3.material C>
$Cr(C_8H_{15}O_2)_3$: Chromium tris(2-ethylhexanoate)
$TbCl_3 \cdot 6H_2O$: Terbium chloride hexahydrate
<Table 4.material A>
$Cu(C_{10}H_{19}O_2)_2$: Copper neodecanoate
$Cd(NO_3)_2 \cdot 2H_2O$: Cadmium nitrate dehydrate
<Table 4.material B>
$Ca(C_8H_{15}O_2)_2$: Calcium 2-ethylhexanoate
$InCl_3 \cdot 4H_2O$: Indium chloride tetrahydrate
<Table 4.material C>
$SnCl_4 \cdot 5H_2O$: Tin chloride pentahydrate
<Table 1 to Table 4.solvent D>
Octylic acid
EGME: Ethylene glycol monomethyl ether
PGME: Propylene glycol 1-monomethyl ether
DMF: N,N-dimethylformamide
EGIPE: Ethylene glycol monoisopropyl ether
Toluene: Toluene
Xylene: Xylene
<Table 1 to Table 4.solvent E>
EG: Ethylene glycol
PG: Propylene glycol
CHB: Cyclohexylbenzene
<Table 1 to Table 4.solvent F>
MeOH: Methanol
EtOH: Ethanol
IPA: Isopropanol
$H_2O$: Water Example 2

<Preparation of Inorganic EL Element>

An inorganic EL element was prepared in the same manner as in Example 1 except that the hole transporting layer (HTL), the light emitting layer (EML), and the electron transporting layer (ETL) were produced using coating liquids described in Table 5. The prepared inorganic EL element was evaluated in the same manner as in Example 1.

Note that, in the inorganic EL element of Example 2, the oxide film as the hole transporting layer is a p-type oxide semiconductor doped with the luminescent center and functions as the light emitting layer.

Examples 3 and 4

<Preparation of Inorganic EL Element>

An inorganic EL element was prepared in the same manner as in Example 1 except that an anode and a cathode described in Table 5 were used, and the hole transporting layer (HTL), the light emitting layer (EML), and the electron transporting layer (ETL) were prepared using coating liquids described in Table 5.

The prepared inorganic EL element was evaluated in the same manner as in Example 1.

Note that, in the inorganic EL element of Example 3, the oxide film as the electron transporting layer is an n-type oxide semiconductor doped with the luminescent center and functions as the light emitting layer.

The substrate was further subjected to UV ozone cleaning. Then, the coating liquid 2-2 was printed thereon using a spin coating device. The substrate was dried using a hot plate at 120 degrees Celsius for 3 minutes and was baked at 400 degrees Celsius for 1 hour in the atmosphere to stack an electron transporting layer having a thickness of 60 nm.

Finally, aluminium was used to form a film using a film using vacuum vapor deposition through a metal mask to stack an Al cathode having a thickness of 100 nm.

TABLE 5

| Example | Anode | Film thickness (nm) | HTL Coating liquid | Film thickness (nm) | EML Coating liquid | Film thickness (nm) | ETL Coating liquid | Film thickness (nm) | Cathode | Film thickness (nm) |
|---|---|---|---|---|---|---|---|---|---|---|
| 1 | ITO | 100 | 3-1 | 40 | 1-1 | 20 | 2-1 | 40 | Al | 100 |
| 2 | ITO | 100 | — | — | 3-4 | 50 | 2-2 | 50 | Al | 100 |
| 3 | ASC | 100 | 3-2 | 50 | 2-4 | 50 | — | — | ITO | 100 |
| 4 | ASC | 100 | 3-1 | 40 | 1-4 | 20 | 2-2 | 40 | ITO | 100 |

In Table 5, "ITO" represents "tin-doped indium oxide" and "ASC" represents "aluminium (Al)—silicon (Si)—copper (Cu) alloy".

FIG. 9 presented a schematic diagram of an energy diagram of the inorganic EL elements produced in Examples 1 and 4.

FIG. 10 presented a schematic diagram of an energy diagram of the inorganic EL element produced in Example 2.

FIG. 11 presented a schematic diagram of an energy diagram of the inorganic EL element produced in Example 3.

Example 5

<Preparation of Inorganic EL Element>

On an alkali-free glass substrate (with patterning ITO electrode film 100 nm) that had been subjected to UV ozone cleaning, the coating liquid 4-1 was printed using a spin coating device. The substrate was dried using a hot plate at 120 degrees Celsius for 3 minutes and was baked at 400 degrees Celsius for 1 hour in the atmosphere to obtain a hole injecting layer (HIL) having a thickness of 30 nm.

The substrate was further subjected to UV ozone cleaning. Then, the coating liquid 3-3 was printed thereon using a spin coating device. The substrate was dried using a hot plate at 120 degrees Celsius for 3 minutes and was baked at 400 degrees Celsius for 1 hour in the atmosphere to stack a light emitting layer that has a thickness of 30 nm and functions as the hole transporting layer (hole transporting layer that functions as the light emitting layer).

Example 6

<Preparation of Inorganic EL Element>

On an alkali-free glass substrate (with patterning ITO electrode film 100 nm) that had been subjected to UV ozone cleaning, the coating liquid 3-2 was printed using a spin coating device. The substrate was dried using a hot plate at 120 degrees Celsius for 3 minutes and was baked at 400 degrees Celsius for 1 hour in the atmosphere to obtain a hole transporting layer having a thickness of 60 nm.

The substrate was further subjected to UV ozone cleaning. Then, the coating liquid 2-3 was printed thereon using a spin coating device. The substrate was dried using a hot plate at 120 degrees Celsius for 3 minutes and was baked at 400 degrees Celsius for 1 hour in the atmosphere to stack a light emitting layer having a thickness of 30 nm that functions as the electron transporting layer (electron transporting layer that functions as the light emitting layer).

The substrate was further subjected to UV ozone cleaning. Then, the coating liquid 4-2 was printed thereon using a spin coating device. The substrate was dried using a hot plate at 120 degrees Celsius for 3 minutes and was baked at 400 degrees Celsius for 1 hour in the atmosphere to stack an electron injecting layer (EIL) having a thickness of 30 nm.

Finally, aluminium was used to form a film using a film using vacuum vapor deposition through a metal mask to stack an Al cathode having a thickness of 100 nm.

Layer structures of the inorganic EL elements of Examples 5 and 6 were presented in Table 6.

TABLE 6

| Example | Anode | Film thickness (nm) | HIL Coating liquid | Film thickness (nm) | HTL Coating liquid | Film thickness (nm) | EML Coating liquid |
|---|---|---|---|---|---|---|---|
| 5 | ITO | 100 | 4-1 | 30 | — | — | 3-3 |
| 6 | ITO | 100 | — | — | 3-2 | 60 | 2-3 |

| | EML | ETL | EIL | Cathode |
|---|---|---|---|---|
| | Film | Film | Film | Film |

TABLE 6-continued

| Example | thickness (nm) | Coating liquid | thickness (nm) | Coating liquid | thickness (nm) | | thickness (nm) |
|---------|----------------|----------------|----------------|----------------|----------------|-----|----------------|
| 5 | 30 | 2-2 | 60 | — | — | Al | 100 |
| 6 | 30 | — | — | 4-2 | 30 | Al | 100 |

FIG. 12 presented a schematic diagram of an energy diagram of the inorganic EL element produced in Example 5.

FIG. 13 presented a schematic diagram of an energy diagram of the inorganic EL element produced in Example 6.

Similarly to the inorganic EL element of Example 1, the inorganic EL elements of Examples 2 to 6 also exhibited favorable voltage-current characteristics and emission spectrum. That is, they were a direct-current-driven inorganic EL element that emits light at a sufficiently low voltage and a sufficiently high efficiency.

As described above, the inorganic EL element of the present disclosure can provide a stable light emitting element at a low voltage and a high efficiency. In addition, the image display device of the present disclosure is suitable for displaying an image with high quality on a large screen. The system of the present disclosure can display image information with high precision and can be suitably used for, for example, television devices, computer systems, and smartphones.

Aspects of the present disclosure are as follows, for example.

<1> An inorganic EL element including:
an anode;
a hole transporting layer;
a light emitting layer;
an electron transporting layer; and
a cathode,
the anode, the hole transporting layer, the light emitting layer, the electron transporting layer, and the cathode being stacked,
wherein the hole transporting layer is an oxide film,
the light emitting layer is an oxide film, and
the electron transporting layer is an oxide film.

<2> The inorganic EL element according to <1>,
wherein the oxide film as the hole transporting layer is a p-type oxide semiconductor.

<3> The inorganic EL element according to <1> or <2>,
wherein the oxide film as the electron transporting layer is an n-type oxide semiconductor.

<4> The inorganic EL element according to any one of <1> to <3>,
wherein the oxide film as the light emitting layer is formed of an oxide doped with a luminescent center.

<5> The inorganic EL element according to any one of <1> to <4>,
wherein the oxide film as the hole transporting layer is a p-type oxide semiconductor doped with a luminescent center and functions as the light emitting layer.

<6> The inorganic EL element according to any one of <1> to <5>,
wherein the oxide film as the electron transporting layer is an n-type oxide semiconductor doped with a luminescent center and functions as the light emitting layer.

<7> The inorganic EL element according to any one of <4> to <6>,
wherein the luminescent center is a transition metal ion or a rare earth ion.

<8> The inorganic EL element according to any one of <4> to <7>,
wherein the luminescent center includes at least one selected from the group consisting of titanium (Ti), chromium (Cr), manganese (Mn), copper (Cu), tungsten (W), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

<9> The inorganic EL element according to any one of <4> to <6>,
wherein, in the oxide film as the light emitting layer, an oxide having a band gap energy equal to or higher than excitation energy of the luminescent center is a host of the luminescent center.

<10> The inorganic EL element according to any one of <4> to <6>,
wherein, in the oxide film as the light emitting layer, an oxide having a band gap energy equal to or higher than luminescent energy of the luminescent center is a host of the luminescent center.

<11> The inorganic EL element according to any one of <1> to <10>,
wherein the oxide film as the light emitting layer is an oxide including at least one selected from the group consisting of beryllium (Be), magnesium (Mg), calcium (Ca), strontium (Sr), barium (Ba), scandium (Sc), yttrium (Y), lanthanum (La), lutetium (Lu), boron (B), aluminium (Al), gallium (Ga), silicon (Si), germanium (Ge), antimony (Sb), bismuth (Bi), and tellurium (Te).

<12> The inorganic EL element according to <1> to <11>,
wherein the oxide film as the hole transporting layer is a p-type oxide semiconductor including at least one selected from the group consisting of nickel (Ni), copper (Cu), zinc (Zn), ruthenium (Ru), rhodium (Rh), thallium (Tl), tin (Sn), lead (Pb), antimony (Sb), bismuth (Bi), and tellurium (Te).

<13> The inorganic EL element according to any one of <1> to <12>,
wherein the oxide film as the electron transporting layer is an n-type oxide semiconductor including at least one selected from the group consisting of zinc (Zn), cadmium (Cd), gallium (Ga), indium (In), thallium (Tl), germanium (Ge), tin (Sn), lead (Pb), bismuth (Bi), titanium (Ti), and tungsten (W).

<14> The inorganic EL element according to <13>,
wherein the oxide film as the electron transporting layer is the n-type oxide semiconductor further including at least one selected from the group consisting of beryllium (Be), magnesium (Mg), calcium (Ca), strontium (Sr), barium (Ba), scandium (Sc), yttrium (Y), lanthanoid (Ln), boron (B), aluminium (Al), silicon (Si), antimony (Sb), and tellurium (Te).

<15> The inorganic EL element according to <1>,
wherein the oxide film as the light emitting layer is an amorphous oxide film, the oxide film as the hole transporting layer is an amorphous oxide film, and the oxide film as the electron transporting layer is an amorphous oxide film.

<16> The inorganic EL element according to <1>, wherein the inorganic EL element is a direct-current-driven inorganic EL element.

<17> A display element including:
an optical control element that includes the inorganic EL element according to any one of <1> to <16> and is configured to control light output according to a driving signal; and
a driving circuit configured to drive the optical control element.

<18> An image display device configured to display an image corresponding to image data, the image display device including:
a plurality of display elements arranged in a form of matrix, each of the plurality of display elements being the display element according to <17> and the driving circuits including field-effect transistors;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines correspondingly to the image data.

<19> A system including:
the image display device according to <18>; and
an image-data-generating device configured to generate image data based on image information to be displayed and to output the image data to the image display device.

REFERENCE SIGNS LIST 10, 20 field-effect transistor
21 substrate
22 active layer
23 source electrode
24 drain electrode
25 gate insulating layer
26 gate electrode
302 display element
310 display
320 pixel circuit
340 inorganic EL thin film layer
342 electron transporting layer
344 light emitting layer
346 hole transporting layer
350 inorganic EL element
400 display control device

The invention claimed is:

1. An inorganic EL element comprising:
an anode;
a hole transporting layer;
a light emitting layer;
an electron transporting layer; and
a cathode,
the anode, the hole transporting layer, the light emitting layer, the electron transporting layer, and the cathode being stacked,
wherein the hole transporting layer is only an oxide film, the light emitting layer is only an oxide film, and the electron transporting layer is only an oxide film.

2. The inorganic EL element according to claim 1, wherein the oxide film as the hole transporting layer is a p-type oxide semiconductor.

3. The inorganic EL element according to claim 1, wherein the oxide film as the electron transporting layer is an n-type oxide semiconductor.

4. The inorganic EL element according to claim 1, wherein the oxide film as the light emitting layer is formed of an oxide doped with a luminescent center.

5. The inorganic EL element according to claim 4, wherein the luminescent center is a transition metal ion or a rare earth ion.

6. The inorganic EL element according to claim 4, wherein the luminescent center includes at least one selected from the group consisting of titanium (Ti), chromium (Cr), manganese (Mn), copper (Cu), tungsten (W), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

7. The inorganic EL element according to claim 4, wherein, in the oxide film as the light emitting layer, an oxide having a band gap energy equal to or higher than excitation energy of the luminescent center is a host of the luminescent center.

8. The inorganic EL element according to claim 4, wherein, in the oxide film as the light emitting layer, an oxide having a band gap energy equal to or higher than luminescent energy of the luminescent center is a host of the luminescent center.

9. The inorganic EL element according to claim 1, wherein the oxide film as the hole transporting layer is a p-type oxide semiconductor doped with a luminescent center and functions as the light emitting layer.

10. The inorganic EL element according to claim 1, wherein the oxide film as the electron transporting layer is an n-type oxide semiconductor doped with a luminescent center and functions as the light emitting layer.

11. The inorganic EL element according to claim 1, wherein the oxide film as the light emitting layer is an oxide including at least one selected from the group consisting of beryllium (Be), magnesium (Mg), calcium (Ca), strontium (Sr), barium (Ba), scandium (Sc), yttrium (Y), lanthanum (La), lutetium (Lu), boron (B), aluminium (Al), gallium (Ga), silicon (Si), germanium (Ge), antimony (Sb), bismuth (Bi), and tellurium (Te).

12. The inorganic EL element according to claim 1, wherein the oxide film as the hole transporting layer is a p-type oxide semiconductor including at least one selected from the group consisting of nickel (Ni), copper (Cu), zinc (Zn), ruthenium (Ru), rhodium (Rh), thallium (Tl), tin (Sn), lead (Pb), antimony (Sb), bismuth (Bi), and tellurium (Te).

13. The inorganic EL element according to claim 1, wherein the oxide film as the electron transporting layer is an n-type oxide semiconductor including at least one selected from the group consisting of zinc (Zn), cadmium (Cd), gallium (Ga), indium (In), thallium (Tl), germanium (Ge), tin (Sn), lead (Pb), bismuth (Bi), titanium (Ti), and tungsten (W).

14. The inorganic EL element according to claim 13, wherein the oxide film as the electron transporting layer is the n-type oxide semiconductor further including at least one selected from the group consisting of beryllium (Be), magnesium (Mg), calcium (Ca), strontium (Sr), barium (Ba), scandium (Sc), yttrium (Y), lanthanoid (Ln), boron (B), aluminium (Al), silicon (Si), antimony (Sb), and tellurium (Te).

15. The inorganic EL element according to claim 1,
wherein the oxide film as the light emitting layer is an amorphous oxide film,
the oxide film as the hole transporting layer is an amorphous oxide film, and the oxide film as the electron transporting layer is an amorphous oxide film.

16. The inorganic EL element according to claim 1,
wherein the inorganic EL element is a direct-current-driven inorganic EL element.

17. A display element comprising:
an optical control element that includes the inorganic EL element according to claim 1 and is configured to control light output according to a driving signal; and
a driving circuit configured to drive the optical control element.

18. An image display device configured to display an image corresponding to image data, the image display device comprising:
a plurality of display elements arranged in a form of matrix, each of the plurality of display elements being the display element according to claim 17 and the driving circuits including field-effect transistors;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines correspondingly to the image data.

19. A system comprising:
the image display device according to claim 18; and
an image-data-generating device configured to generate image data based on image information to be displayed and to output the image data to the image display device.

* * * * *